US012707788B2

(12) United States Patent
Staub et al.

(10) Patent No.: US 12,707,788 B2
(45) Date of Patent: Aug. 11, 2026

(54) OPTOELECTRONIC SEMICONDUCTOR COMPONENT COMPRISING A PLURALITY OF METALLIC LEAD FRAME PARTS AND PANEL

(71) Applicant: ams-OSRAM International GmbH, Regensburg (DE)

(72) Inventors: Ralf Staub, Regensburg (DE); Michael Zitzlsperger, Regensburg (DE); Andreas Reith, Steinach (DE)

(73) Assignee: ams-OSRAM International GmbH, Regensburg (DE)

( * ) Notice: Subject to any disclaimer, the term of this patent is extended or adjusted under 35 U.S.C. 154(b) by 311 days.

(21) Appl. No.: 18/561,720

(22) PCT Filed: May 13, 2022

(86) PCT No.: PCT/EP2022/063024
§ 371 (c)(1),
(2) Date: Nov. 16, 2023

(87) PCT Pub. No.: WO2022/248247
PCT Pub. Date: Dec. 1, 2022

(65) Prior Publication Data

US 2024/0250228 A1 Jul. 25, 2024

(30) Foreign Application Priority Data

May 26, 2021 (DE) ......................... 102021113592.3

(51) Int. Cl.
*H10H 20/857* (2025.01)
*H10H 20/852* (2025.01)
*H10W 90/00* (2026.01)

(52) U.S. Cl.
CPC ........ *H10H 20/857* (2025.01); *H10H 20/852* (2025.01); *H10W 90/00* (2026.01)

(58) Field of Classification Search
CPC .. H10H 20/852; H10H 20/854; H10H 20/856; H10H 20/857; H10H 20/8506; H10W 90/00

(Continued)

(56) References Cited

U.S. PATENT DOCUMENTS 10,438,897 B2 10/2019 Foo et al.
11,462,500 B2 10/2022 Hien et al.

(Continued)

FOREIGN PATENT DOCUMENTS

CN 101971353 A 2/2011
CN 105794005 A 7/2016

(Continued)

*Primary Examiner* — Didarul A Mazumder
(74) *Attorney, Agent, or Firm* — Slater Matsil, LLP

(57) ABSTRACT

In an embodiment an optoelectronic semiconductor device includes an optoelectronic semiconductor chip configured to generate radiation and attached to a mounting side of a carrier and an encapsulation body at least partially transparent to the radiation, wherein the carrier is composed of a plurality of separate, metallic lead frame parts and of a potting body, the potting body holding the lead frame parts together, wherein the lead frame parts project beyond the potting body at the mounting side, wherein an attachment side of the carrier is opposite the mounting side so that the mounting side is further away from the attachment side than sides of the potting body facing away from the attachment side, wherein, as seen in a plan view of the attachment side, the potting body projects over the lead frame parts on all sides.

19 Claims, 9 Drawing Sheets

(58) Field of Classification Search
USPC .......................................................... 257/777
See application file for complete search history.

(56) References Cited

U.S. PATENT DOCUMENTS

| | | | | |
|---|---|---|---|---|
| 2012/0175657 | A1* | 7/2012 | Chen .................... | H10H 20/857<br>257/98 |
| 2012/0313131 | A1 | 12/2012 | Oda et al. | |
| 2013/0126935 | A1 | 5/2013 | Zitzlsperger et al. | |
| 2014/0117388 | A1 | 5/2014 | Kuo et al. | |
| 2017/0288108 | A1* | 10/2017 | Schumann ......... | H10H 20/8506 |
| 2019/0027661 | A1* | 1/2019 | Li ........................ | H10H 20/857 |
| 2023/0268477 | A1 | 8/2023 | Zitzlsperger | |

FOREIGN PATENT DOCUMENTS

| | | | |
|---|---|---|---|
| CN | 108987367 | A | 12/2018 |
| DE | 102017128457 | A1 | 6/2019 |
| DE | 102018101813 | A1 | 8/2019 |
| DE | 102020004863 | A1 | 2/2022 |
| JP | 2017069342 | A | 4/2017 |
| WO | 2017040482 | A1 | 3/2017 |

* cited by examiner

B-B

A-A 1
30,34
2
A
E
35
32
B
B
32,34
4
33
A

B-B
1
4
2
52
35
32
E
Tm
Tt
Dmin
34
33
34
30

A-A
E
1
30
32
2
52
35
34
3
33
4

FIG 11
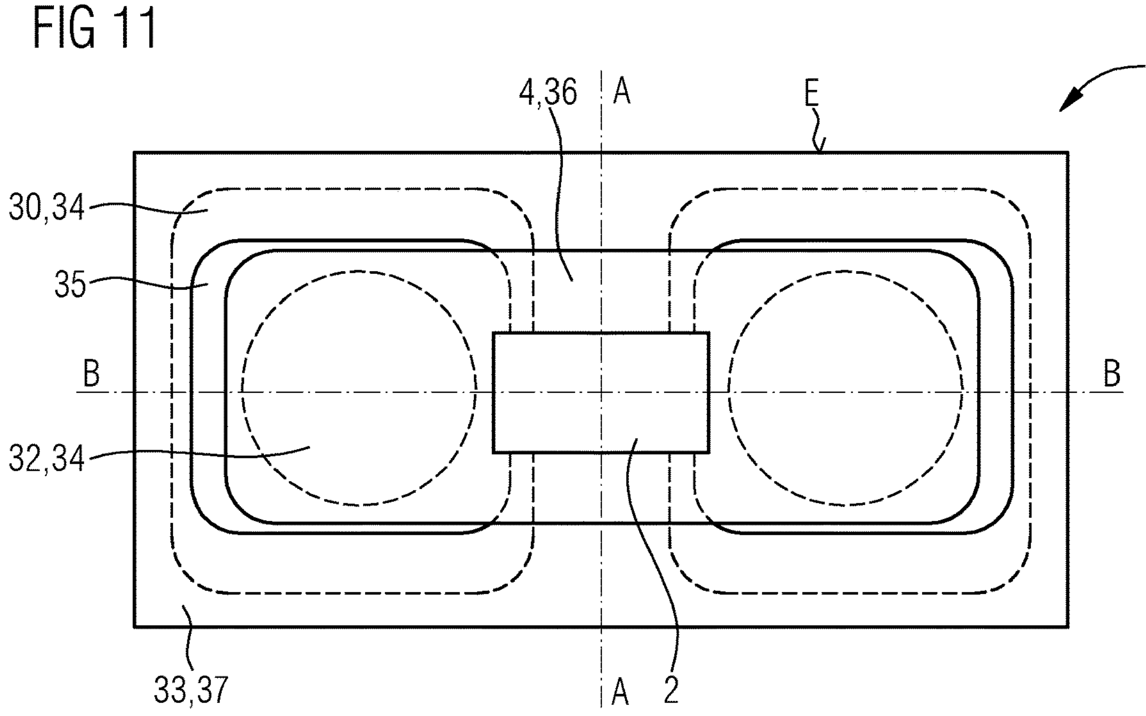
FIG 12
B-B
1
4
32
2
52
35
37
E
33
30
33
34
FIG 13
A-A
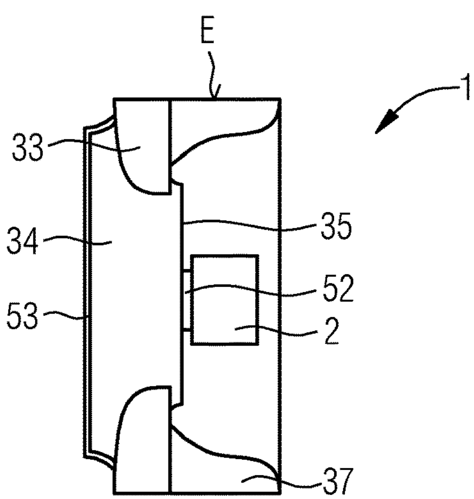

OPTOELECTRONIC SEMICONDUCTOR COMPONENT COMPRISING A PLURALITY OF METALLIC LEAD FRAME PARTS AND PANEL

CROSS-REFERENCE TO RELATED APPLICATIONS

This patent application is a national phase filing under section 371 of PCT/EP2022/063024, filed May 13, 2022, which claims the priority of German patent application 102021113592.3, filed May 26, 2021, each of which is incorporated herein by reference in its entirety.

TECHNICAL FIELD

An optoelectronic semiconductor device is provided. Furthermore, a panel and a manufacturing method for such optoelectronic semiconductor devices are provided.

BACKGROUND

Document DE 10 2017 128 457 A1 relates to the manufacture of optoelectronic semiconductor devices.

Document DE 10 2020 004 863 A1 refers to optoelectronic semiconductor devices.

SUMMARY

Embodiments provide an optoelectronic semiconductor device that can be manufactured efficiently.

According to at least one embodiment, the optoelectronic semiconductor device comprises a carrier. The carrier is preferably the component mechanically supporting and carrying the semiconductor device. In particular, the carrier is mechanically rigid so that the carrier, and thus the semiconductor device, does not deform or does not deform significantly during an intended use of the semiconductor device.

According to at least one embodiment, the semiconductor device comprises one or more optoelectronic semiconductor chips. The at least one optoelectronic semiconductor chip is, for example, a light-emitting diode, LED for short, or a laser diode, LD for short. Likewise, the optoelectronic semiconductor chip may be a detector, such as a photodiode. If several of the optoelectronic semiconductor chips are present, all semiconductor chips may be identical in construction or different types of optoelectronic semiconductor chips may be combined, for example, several LEDs with different emission colors and optionally additionally at least one photodiode.

According to at least one embodiment, the at least one optoelectronic semiconductor chip comprises a semiconductor layer sequence. The semiconductor layer sequence comprises at least one active region, which is arranged to generate radiation by means of electroluminescence during operation of the light-emitting diode chip. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or such as $Al_nGa_mIn_{1-n-m}As_kP_{1-k}$, where in each case $0 \leq n \leq 1$, $0 \leq m \leq 1$ and $n+m \leq 1$ as well as $0 \leq k < 1$. For example, $0 < n \leq 0.8$, $0.4 \leq m \leq 1$ and $n+m \leq 0.95$ as well as $0 < k \leq 0.5$ apply to at least one layer or to all layers of the semiconductor layer sequence. In this context, the semiconductor layer sequence may comprise dopants as well as additional components. For the sake of simplicity, however, only the essential constituents of the crystal lattice of the semiconductor layer sequence, that is, Al, As, Ga, In, N or P, are mentioned, even if these may be partially replaced and/or supplemented by small amounts of additional substances.

The semiconductor layer sequence comprises at least one active layer configured to generate the radiation. The active layer includes in particular at least one pn junction and/or at least one quantum well structure. A radiation generated by the active layer in operation is, for example, in the spectral range between 400 nm and 800 nm inclusive.

According to at least one embodiment, the at least one optoelectronic semiconductor chip is attached to a mounting side of the carrier, for example, soldered or sintered on or electrically conductively glued on or also attached by means of friction welding. The mounting side may be flat. The mounting side occupies either only a part or an entire main side of the carrier, this main side being opposite an attachment side of the carrier.

According to at least one embodiment, the attachment side is configured for surface mounting. This means that the semiconductor device can be attached to an external part, such as a printed circuit board, using surface mount technology, or SMT for short.

According to at least one embodiment, the carrier is composed of several leadframe parts and of at least one potting body. The lead frame parts are preferably separate metallic parts spaced apart from each other. For example, the lead frame parts are made of copper or a copper alloy, and surfaces of the lead frame parts that are not covered by the potting body may be provided with coatings. Such coatings include, for example, Ag, Al, Cr, Ni, Pd and/or Pt.

According to at least one embodiment, the potting body holds the lead frame parts together mechanically. This means in particular that without the potting body the lead frame parts would not have a fixed mechanical connection to each other. For this purpose, the potting body preferably extends in part on side surfaces of the lead frame parts, the side surfaces being oriented transversely to the attachment side and/or to the mounting side.

According to at least one embodiment, the lead frame parts project beyond the potting body on the attachment side of the carrier. It is possible for the lead frame parts and the potting body to be flush with each other on the attachment side.

According to at least one other embodiment, the lead frame parts project beyond the potting body on the attachment side of the carrier. It is possible for the lead frame parts and the potting body to be flush with each other on the attachment side.

According to at least one embodiment, the lead frame parts are wider outside the potting body than inside the potting body, in particular when viewed in the direction parallel to the attachment side. That is, seen in plan view on the attachment side, the lead frame parts can each be larger than seen on the mounting side. It is possible, but not necessary, for the lead frame parts to become continuously narrower in the direction toward the mounting side. Likewise, it is possible that the lead frame parts, starting from the attachment side, become wider or continuously wider in the direction towards the potting body and then become narrower or continuously narrower inside the potting body and towards the mounting side.

According to at least one embodiment, the potting body protrudes beyond the lead frame parts on all sides, as seen in plan view on the attachment side. That is, seen in plan view, the potting body protrudes over the lead frame parts all around. Thus, outer side surfaces of the semiconductor device can be formed by the potting body and the lead frame parts do not extend to the outer side surfaces.

In at least one embodiment, the optoelectronic semiconductor device comprises a carrier and at least one optoelectronic semiconductor chip which is attached to a mounting side of the carrier, wherein

- the carrier is composed of a plurality of separate, metallic lead frame parts and of a potting body, and the potting body holds the lead frame parts together,
- the lead frame parts project beyond the potting body on an attachment side of the carrier and the attachment side is opposite the mounting side and/or the lead frame parts project beyond the potting body on the attachment side,
- the attachment side is configured for surface mounting,
- optionally the lead frame parts are wider outside the potting body than inside the potting body, as seen in the direction parallel to the mounting side,
- the potting body projects beyond the lead frame parts on all sides, as seen in plan view of the attachment side.

Preferably, the lead frame parts extend at least as close to the attachment side as the potting body. This means that the potting body can project beyond the lead frame parts on the attachment side or, particularly preferably, the lead frame parts are flush with the potting body on the attachment side. The term "flush" may be assigned a tolerance of at most 20 μm or of at most 10 μm or of at most 2 μm.

According to at least one embodiment, the lead frame parts on or directly on the mounting side are directly covered by the potting body on all sides in the direction parallel to the mounting side. This means, for example, that, viewed from the side of the semiconductor device, at the mounting side the lead frame parts are not exposed but are covered by the potting body. In the lateral direction, that is, in the direction parallel to the attachment side, the lead frame parts close to the attachment side are thus in physical contact with the potting body all around.

Thus, the device described herein is, in particular, a lead frame-based optoelectronic semiconductor device without exposed metals on side surfaces of a package.

The device described here can be miniaturized compared to other designs of optoelectronic semiconductor devices and can be used, for example, in the automotive sector, in consumer electronics or in industry. An exemplary application is the use in multi-function rear lights of cars, in which many of the devices described herein may be incorporated, so that many pixels can be formed with a comparatively low resolution.

That the lead frame parts are laterally overlapped by the potting body allows increased corrosion protection to be achieved, as all metallic structures, with the exception of soldering surfaces, are encapsulated on the outside. This concept is made possible in particular by the fact that the lead frame parts in a panel for the components are not connected by means of tie bars.

Leadframe-based carriers are a possible substrate for optoelectronic SMT devices. Leadframe structuring is achieved in particular by etching the leadframe from above and below. To hold the leadframe together and provide mechanical stability, interconnect bars are usually required to connect the individual leadframe parts. This approach with connecting bars introduces two basic problems:

- Exposed material of the connecting bars, especially copper, on a device side surface where the connecting bars cross a separation line: Exposed copper in optoelectronic packages can lead to reduced corrosion stability and shunts due to electromigration. There is also an increased risk of electrical shorting between closely placed devices on a PCB when copper is exposed on a package surface.
- Limited miniaturization of lead frame structures due to the relatively thick lead frame sheet: Precise structures of less than 100 μm are very difficult to realize with lead frame-based carriers.

Alternative approaches, such as printed circuit boards or ceramic-based substrates as carriers for the at least one optoelectronic semiconductor chip, have comparatively large geometric tolerances and are not cost-effective for small devices with a high density of electrical vias.

In the semiconductor devices described herein, construction elements that can also be referred to as Routable QFN, or Rt-QFN for short, are used in particular to manufacture small optoelectronic devices on leadframe-based carriers without exposed copper on package side surfaces. Thus, Rt-QFN leadframe-based carriers are used for the surface-mount semiconductor devices in the present case without the metallic leadframe parts being interconnected by interconnection bars. The functional lead frame parts, such as anode pads and cathode pads, of the individual devices are insulated and embedded in the Rt-QFN molded layer, that is, in the potting body. For the device separated out of the associated panel, all exposed metal surfaces are avoided.

The approach described here allows layouts with pad spacings well below 100 μm on the mounting side of the carrier. This enables optoelectronic packages with small flip chips on leadframe-based carriers.

Thus, by omitting the tie bars, increased stability against corrosion and electromigration can be achieved. It is also possible to mount the optoelectronic semiconductor devices with a high packing density on a mounting substrate, such as a printed circuit board. When the optoelectronic semiconductor devices are separated from the panel, there is no metal abrasion that could lead to short circuits. Starting points for cracks at sharp metal edges on a component outer surface are avoided. Furthermore, flip chips with pad spacings well below 100 μm can also be mounted directly on the leadframe-based carrier.

According to at least one embodiment, the carrier further comprises one or more metallizations. The preferably multiple metallizations may together partially form the mounting side. The at least one optoelectronic semiconductor chip may be directly deposited on one or more of the metallizations, such that at most one connecting means is located between the semiconductor chip and the at least one associated metallization.

According to at least one embodiment, the preferably multiple metallizations each emanate from the associated lead frame part. Preferably, each of the metallizations is assigned to exactly one of the lead frame parts. Alternatively, a metallization can also extend to two of the lead frame parts. None, one or more of the metallizations are assigned to the lead frame parts in each case. There can be a one-to-one assignment between the metallizations on the mounting side and the lead frame parts.

According to at least one embodiment, the preferably multiple metallizations extend directly onto the potting body. In other words, the at least one metallization may contact the potting body.

Optionally, in addition to the preferably multiple metallizations on the mounting side, at least one further metal coating is present on the attachment side, wherein the at least one further metal coating can also extend directly onto the potting body and can originate from an associated lead frame part.

According to at least one embodiment, a minimum distance between adjacent metallizations on the mounting side is at most 100 μm or at most 70 μm or at most 50 μm or at most 30 μm. That is, the metallizations can reach close to each other.

According to at least one embodiment, the at least one optoelectronic semiconductor chip is a flip chip that is mounted directly on the mounting side, in particular directly on two of the metallizations. If several of the optoelectronic semiconductor chips are present, all semiconductor chips may be flip chips or flip chips with semiconductor chips to be contacted on both sides are present in combination.

According to at least one embodiment, the potting body is designed as a single piece. Alternatively, a multi-component potting body, for example, produced by means of multi-component injection molding, can be present in the semiconductor device.

According to at least one embodiment, the lead frame parts each have a thickness of at most 0.5 mm or of at most 0.2 mm or of at most 0.1 mm or of at most 50 μm. A thickness of the potting body is, for example, at most 90% or at most 80% of the thickness of the lead frame parts.

According to at least one embodiment, the attachment side is formed exclusively by the lead frame parts. This means that the potting body ends at a distance from the attachment side. For example, the lead frame parts project beyond the potting body towards the attachment side by at least 10 μm or by at least 5 μm.

According to at least one embodiment, seen in plan view on the attachment side and at at least one location, a distance between an outer outline of the carrier and the lead frame parts is at least 0.1 mm or at least 10 μm or at least 5 μm. Alternatively or additionally, this distance is at most 1 mm or at most 0.2 mm or at most 40 μm. The outer outline, also referred to as contour line, is formed, for example, exclusively by the potting body and/or by an encapsulation body. The outer outline is thus assigned in particular to side surfaces of the semiconductor device which are preferably formed only by the potting body and/or by the encapsulation body, so that the side surfaces can be free of metals and electrically conductive structures.

According to at least one embodiment, the carrier is plane. For example, the mounting side and the attachment side are then each planar surfaces oriented parallel to each other.

According to at least one embodiment, the carrier is flat. This means, for example, that in a direction parallel to the attachment side, a lateral extent of the carrier is at least three times or at least five times or at least ten times greater than a thickness of the carrier in a direction perpendicular to the attachment side. If the attachment side is rectangular, the lateral extension is equal to a diagonal length of the attachment side.

According to at least one embodiment, the potting body forms a cavity in which the at least one optoelectronic semiconductor chip is mounted. In this case, the potting body preferably projects beyond the at least one optoelectronic semiconductor chip in the direction away from the mounting side. If several of the semiconductor chips are present, a separate cavity may be provided for each semiconductor chip, or groups of semiconductor chips may be distributed over several cavities, or all semiconductor chips may be located in a common cavity. The cavity or some of the cavities or all of the cavities are preferably open in the direction away from the mounting side, so that the at least one associated semiconductor chip is not covered by the potting body.

According to at least one embodiment, the optoelectronic semiconductor device further comprises at least one encapsulation body. Preferably, the encapsulation body is at least partially transparent to radiation generated by the at least one optoelectronic semiconductor chip during operation. For example, the encapsulation body is a seal against environmental influences and/or forms a conversion medium body for a wavelength change of the radiation generated by the associated semiconductor chip in operation. Several different encapsulation bodies may be present, for example, with different phosphors or optical filter materials.

According to at least one embodiment, the encapsulation body completely covers the at least one optoelectronic semiconductor chip.

According to at least one embodiment, the semiconductor device comprises one or more further lead frame parts. Preferably, the at least one further lead frame part is made of a metal, in particular of copper or of a copper alloy. The at least one further lead frame part is thinner than the carrier. In particular, the at least one further lead frame part penetrates the potting body at most partially. For example, the at least one further lead frame part has a thickness equal to the total thickness of the carrier minus the thickness of the potting body.

According to at least one embodiment, the at least one further lead frame part is made of the same material as the lead frame parts. In particular, the lead frame parts and the at least one further lead frame part are produced from the same metal sheet, for example, by means of etching.

According to at least one embodiment, the at least one further lead frame part is electrically non-functional. For example, the at least one further lead frame part is then electrically isolated from the lead frame parts. In this case, the at least one further lead frame part is, for example, a stop edge for an optics body, such as a lens, or a stop edge for a potting body, in particular when creating the body in question.

According to at least one embodiment, the at least one further lead frame part has an electrical function. For example, the at least one further lead frame part then forms an electrical conductor path, for example, to electrically interconnect a plurality of the semiconductor chips.

Several different types of further lead frame parts may be present in the semiconductor device, for example, at least one electrically functionless further lead frame part and at least one electrically functionalized further lead frame part.

According to at least one embodiment, a gap between adjacent lead frame parts is at most 80% or at most 55% of a difference of a thickness of the lead frame parts and a thickness of the potting body between the adjacent lead frame parts. For example, this gap is at most 50 μm or at most 40 μm or at most 20 μm. This is made possible in particular by the half-etching of the lead frame parts.

According to at least one embodiment, the potting body has a reflectivity of at most 50% or at most 20% for radiation generated by the semiconductor chip during operation of the semiconductor chip. Alternatively or additionally, the reflectivity is at least 0.5% or at least 1% or at least 2%.

According to at least one embodiment, the mounting side is located further away from the attachment side than sides of the potting body facing away from the attachment side. In other words, the lead frame parts overhang the potting body in the direction away from the attachment side. That is, the lead frame parts may have a greater thickness than the potting body. At the attachment side, in this case, the lead frame parts and the potting body can be flush with each other, or the lead frame parts together with a metallization can be flush with each other at the attachment side.

According to at least one embodiment, side surfaces of the lead frame parts are covered with respect to dielectric solids exclusively by the potting body or by the potting body together with the encapsulation body directly. That is, the only dielectric solids in contact with the side surfaces of the lead frame parts are the potting body and optionally also the encapsulation body. Thus, no other electrically insulating solid materials are present on the side surfaces of the lead frame parts, except for the encapsulation body and the potting body. It is possible that the side surfaces of the lead frame parts are thereby partially or completely covered by the at least one metallization or by an electrical connection means, such as a solder. Alternatively, the side surfaces of the lead frame parts may be covered exclusively by the potting body and optionally by the encapsulation body, so that the potting body and optionally the encapsulation body are then the only solids on the side surfaces.

In addition, a panel for optoelectronic semiconductor devices as described in connection with one or more of the above embodiments is disclosed. Features of the panel are therefore also disclosed for the optoelectronic semiconductor devices, and vice versa.

In at least one embodiment, the panel is provided for optoelectronic semiconductor devices. In particular, the panel represents an intermediate product in the manufacture of the optoelectronic semiconductor devices. Preferably, the panel comprises a plurality of component units such that each of the component units is provided for one of the finished optoelectronic semiconductor devices. Preferably, the potting body extends contiguously across all of the component units of a component group. Each component group preferably includes a plurality of the component units arranged, for example, in a matrix within the respective component group.

According to at least one embodiment, the panel includes a plurality of the component groups such that each of the component groups also includes a plurality of the component units.

According to at least one embodiment, a metallic support bar is located between at least some adjacent component groups. The support bar can extend continuously along several of the component groups.

According to at least one embodiment, the support bar is made of the same material as the lead frame parts. In particular, the support bar and the lead frame parts are made from the same semi-finished product, for example, by means of etching and/or stamping.

According to at least one embodiment, the support bar is at least as thick or as thick as the lead frame part.

According to at least one embodiment, the support bar has several anchoring bays as seen in plan view of the attachment sides of the adjacent component units. The potting body engages in the anchoring bays.

Such support bars allow the panel to be mechanically stabilized and thus efficiently handled during a manufacturing of the semiconductor devices in the component assembly. The support bars can be arranged in a grid shape and thus can have crossing points. If the semiconductor devices are sufficiently small, the support bar can replace complete rows or columns of the otherwise existing semiconductor devices.

In addition, a method of manufacturing optoelectronic semiconductor devices as described in connection with one or more of the above embodiments is provided. Features of the method are therefore also disclosed for the optoelectronic semiconductor devices and vice versa.

In at least one embodiment, the method of fabricating the optoelectronic semiconductor devices comprises the following steps, particularly in the order indicated:

A) producing a panel designed as described above, and

B) separating the component groups in the panel to form the optoelectronic semiconductor devices, wherein the potting body is divided between adjacent component units.

According to at least one embodiment, the at least one support bar is completely removed from the optoelectronic semiconductor devices in step B). This means that in the finished optoelectronic semiconductor devices, preferably nothing more can be seen of the support bars.

In the following, an optoelectronic semiconductor device described herein, a panel described herein and a method described herein are explained in more detail with reference to the drawing on the basis of embodiment examples. Identical reference signs indicate identical elements in the individual figures. However, no references are shown to scale, rather individual elements may be shown exaggeratedly large for better understanding.

BRIEF DESCRIPTION OF THE DRAWINGS

In the figures:

FIG. 11 shows a schematic top view of an exemplary embodiment of an optoelectronic semiconductor device described herein;

FIG. 12 shows a schematic longitudinal cross-section of the optoelectronic semiconductor device of FIG. 11;

FIG. 13 shows a schematic transverse cross-section of the optoelectronic semiconductor device of FIG. 11;

DETAILED DESCRIPTION OF ILLUSTRATIVE EMBODIMENTS

Figure 1:
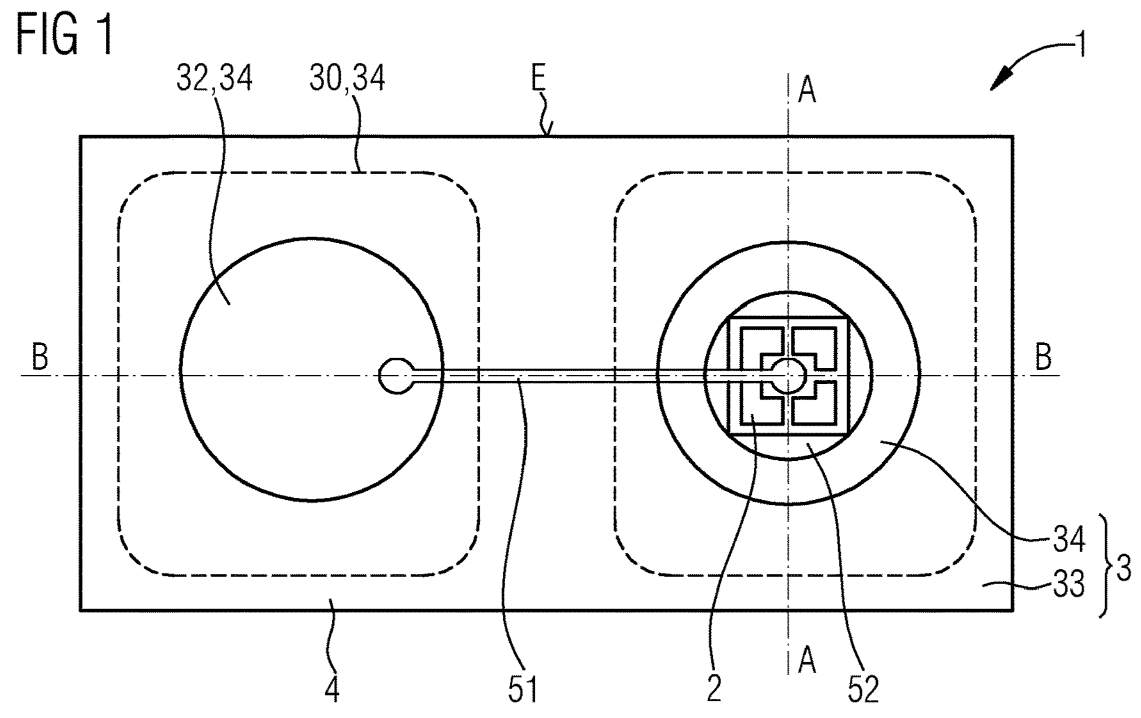
FIG. 1 shows a schematic top view of an exemplary embodiment of an optoelectronic semiconductor device described herein.
Figure 2:
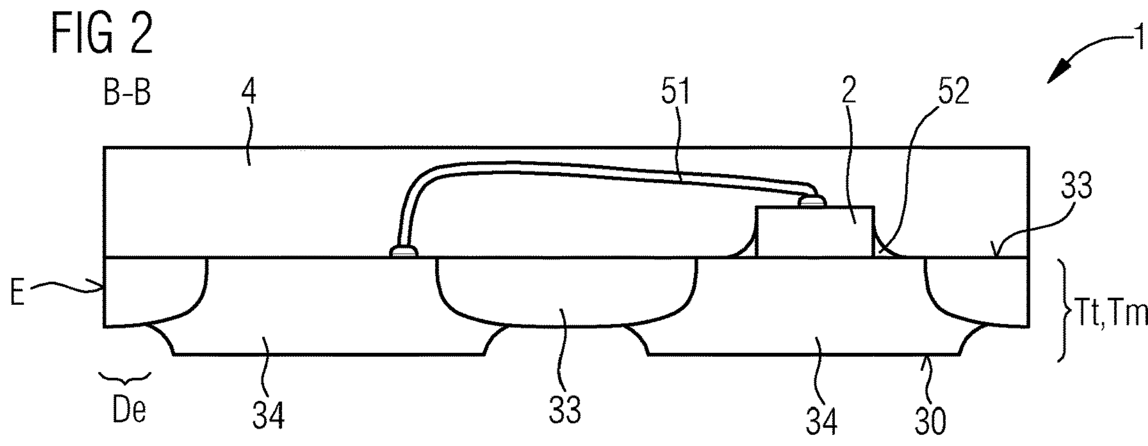
FIG. 2 shows a schematic longitudinal cross-section of the optoelectronic semiconductor device of FIG. 1.
Figure 3:
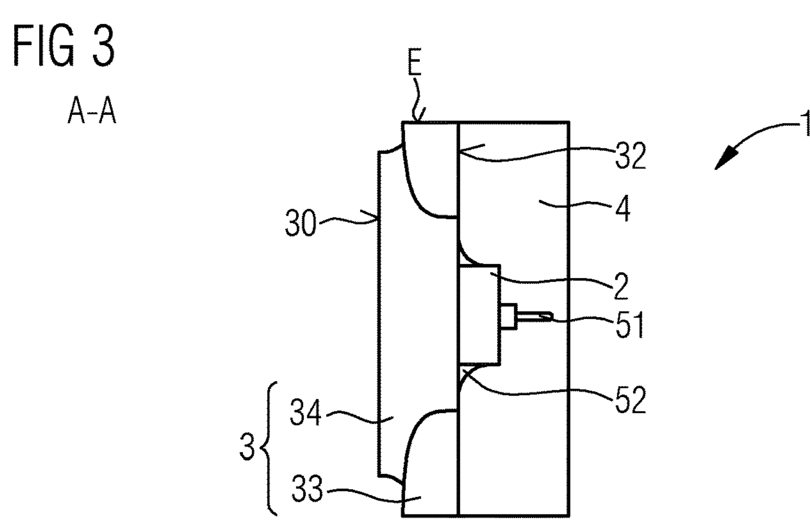
FIG. 3 shows a schematic transverse cross-section of the optoelectronic semiconductor device of FIG. 1.

FIGS. 1 to 3 show an exemplary embodiment of an optoelectronic semiconductor device 1. The semiconductor device 1 includes a carrier 3 and an optoelectronic semiconductor chip 2, such as an LED chip. The semiconductor chip 2 is attached to a mounting side 32 of the carrier 3, the mounting side 32 is opposite of an attachment side 30. Optionally, the mounting side 32 and the attachment side 30 are oriented parallel to each other.

The carrier 3 is composed of several separate lead frame parts 34 and a potting body 33, the potting body 33 mechanically connecting the lead frame parts 34. The lead frame parts 34 are, for example, copper pieces etched on both sides, which may be produced from a common metal sheet. On the attachment side 30, the lead frame parts 34 project beyond the potting body 33, and on the mounting side 32, the lead frame parts 34 are optionally flush with the potting body 33.

It is possible that the lead frame parts 34 are wider at the attachment side 30 and/or outside the potting body 33 than inside the potting body 33 and/or at the mounting side 32. For example, a thickness Tm of the lead frame parts 34 is at least 30 μm and/or at most 500 μm. For example, the thickness Tm of the lead frame parts 34 is equal to a thickness Tt of the carrier 3.

In this case, the lead frame parts 34 are spaced apart from an outer outline E of the carrier 3 so that the lead frame parts 34 do not extend to outer sides of the semiconductor device 1. For example, a smallest distance De between the outer outline E and the lead frame parts 34 is at least 10 μm and/or at most 1 mm. That is, side surfaces of the semiconductor device 1 are preferably defined by the potting body 33, and not by the lead frame parts 34.

By arranging the lead frame parts 34 in the potting body 33 in such a manner, adjacent semiconductor devices 1 can be mounted close to each other on an external mounting platform, not shown. In addition, corrosion of the lead frame parts 34 from the side surfaces of the carrier 3 is reduced. That is, the carrier 3 is free of connecting bars on the lead frame parts 34, also referred to as tie bars.

For example, the at least one semiconductor chip 2 is attached to one of the lead frame parts 34 by means of an electrically conductive connecting means 52 and is electrically connected to a second one of the lead frame parts 34 by means of a bond wire 51. Further, an encapsulation body 4 may optionally be provided to protect the semiconductor chip 2 from the outside. The encapsulation body 4 is, for example, clear transparent, milky opaque, and/or includes a phosphor for wavelength conversion of a radiation generated by the semiconductor chip 2 in operation. The encapsulation body 4 may have a flat top surface facing away from the carrier 2.

Lateral dimensions of the semiconductor devices 1, as seen in plan view of the attachment side 30, are, for example, at least 0.2 mm×0.1 mm or at least 0.4 mm×0.2 mm and/or at most 6 mm×3 mm or at most 1.2 mm×0.8 mm.

Figure 4:
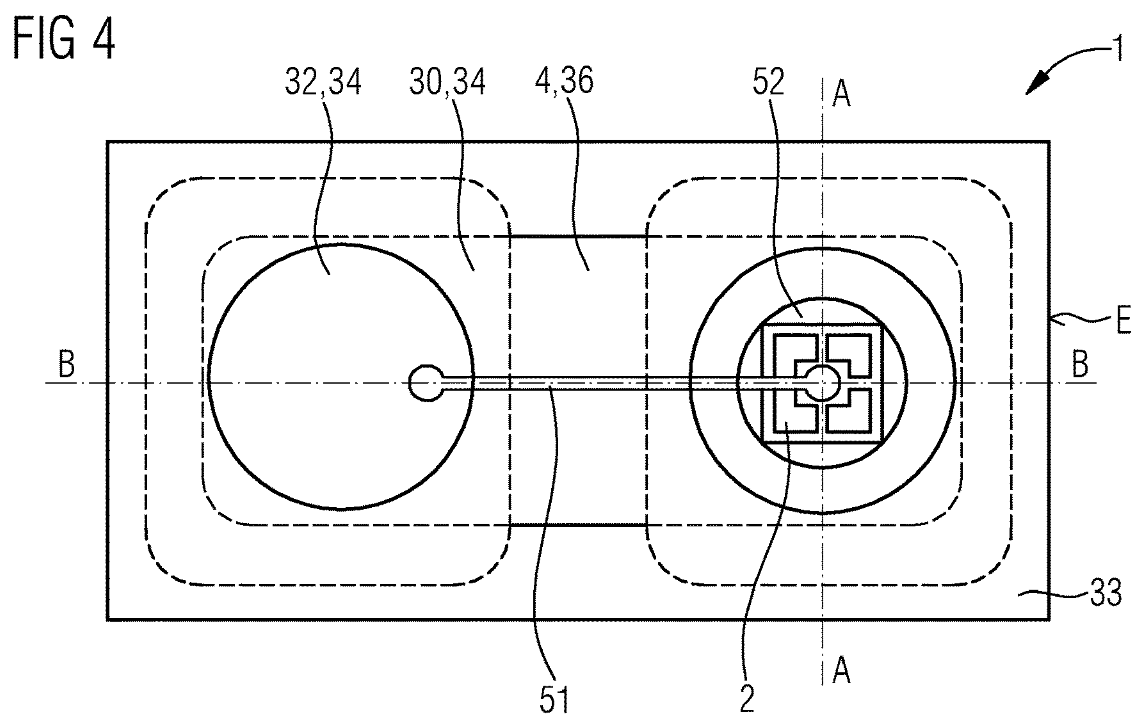
FIG. 4 shows a schematic top view of an exemplary embodiment of an optoelectronic semiconductor device described herein.
Figure 5:
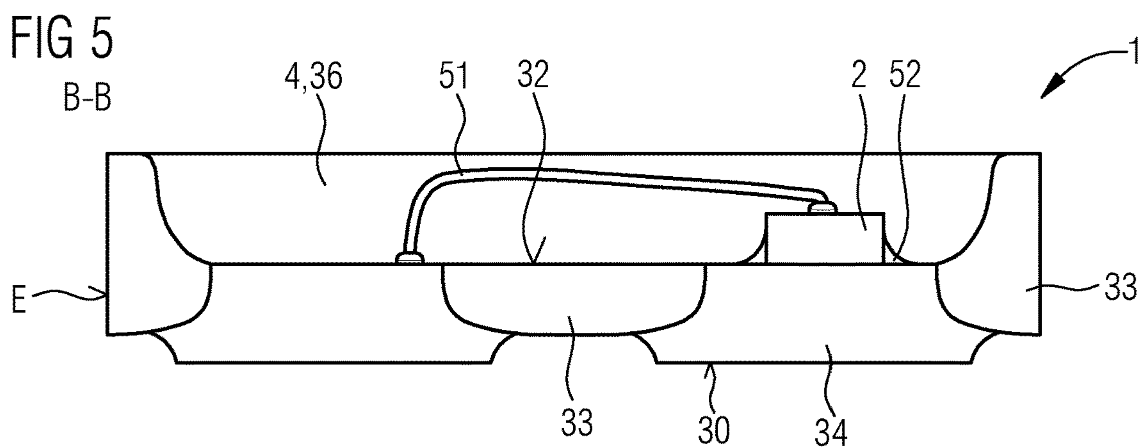
FIG. 5 shows a schematic longitudinal cross-section of the optoelectronic semiconductor device of FIG. 4.
Figure 6:
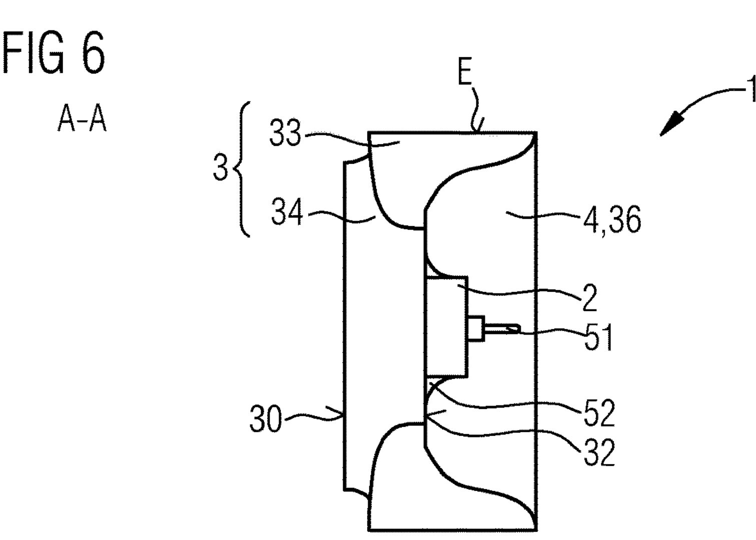
FIG. 6 shows a schematic transverse cross-section of the optoelectronic semiconductor device of FIG. 4.

In the exemplary embodiment of FIGS. 4 to 6, it is shown that the encapsulation body 33 forms a cavity 36 in which the at least one optoelectronic semiconductor chip 2 is located. Optionally, the encapsulation body 4 is located in the cavity 36. In the direction away from the attachment side 30, the encapsulation body 4 and the potting body 33 may be flush with each other.

In the example of FIGS. 4 to 6, the carrier 3 is thus comparatively thick. The mounting side 32 is formed by a bottom of the cavity 36 and is composed of the potting body 33 and the lead frame parts 34.

In all other respects, the comments on FIGS. 1 to 3 apply in the same way to FIGS. 4 to 6.

Figure 7:
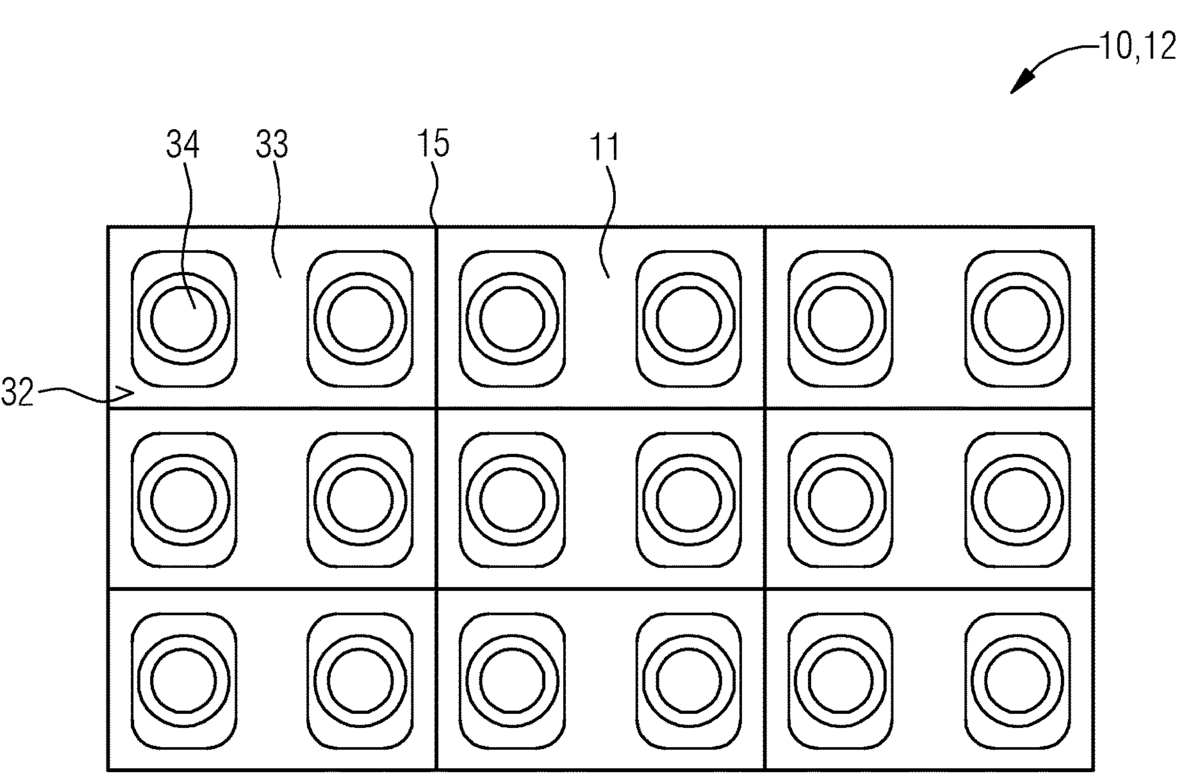
FIG. 7 shows a schematic top view of a panel for optoelectronic semiconductor devices according to FIGS. 1 to 6.

FIG. 7 shows an exemplary embodiment of a panel 10 which can be used to manufacture the semiconductor devices 1 of FIGS. 1 to 6. For this purpose, the panel 10 comprises many component units 11. Each of the component units 11 corresponds, for example, to a carrier section for one of the finished semiconductor devices 1. Separation lines 15 run between adjacent component units 11, along which the panel 10 is then separated to form the semiconductor devices 1.

The component units 11 may be combined to form a component group 12. Over the entire component group 12, the potting body 33 is contiguous and thus designed as a single piece. In the component group 12, the component units 11 are arranged in a matrix, for example, in a 3×3 matrix.

In all other respects, the comments on FIGS. 1 to 6 apply in the same way to FIG. 7, and vice versa.

Figure 8:
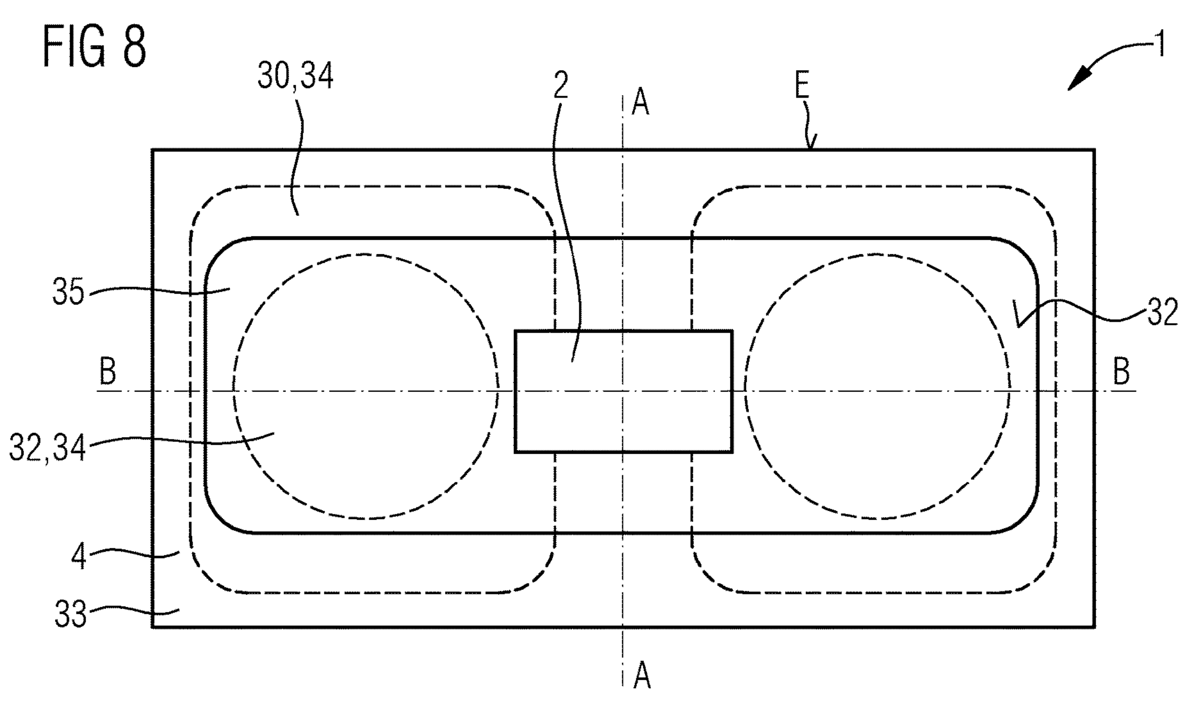
FIG. 8 shows a schematic top view of an exemplary embodiment of an optoelectronic semiconductor device described herein.
Figure 9:
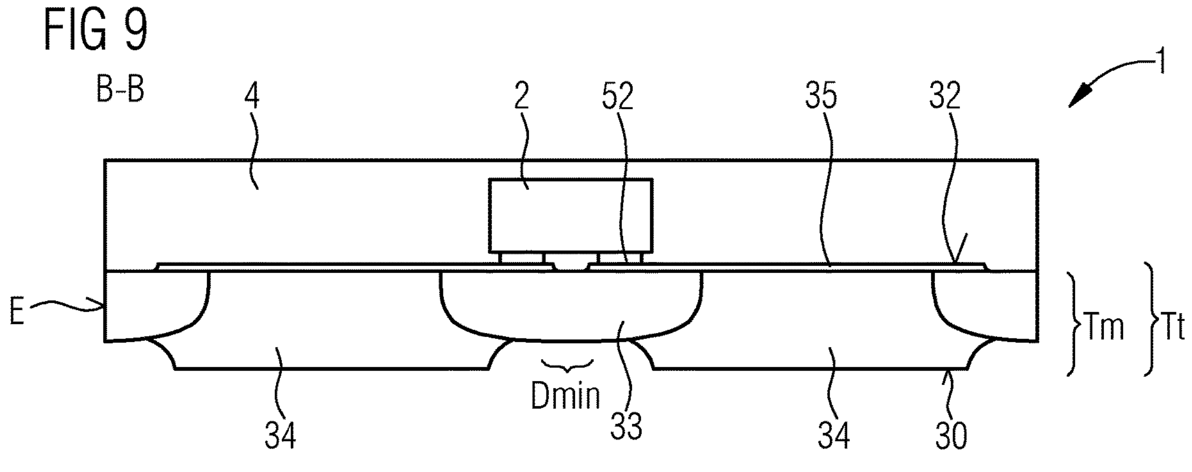
FIG. 9 shows a schematic longitudinal cross-section of the optoelectronic semiconductor device of FIG. 8.
Figure 10:
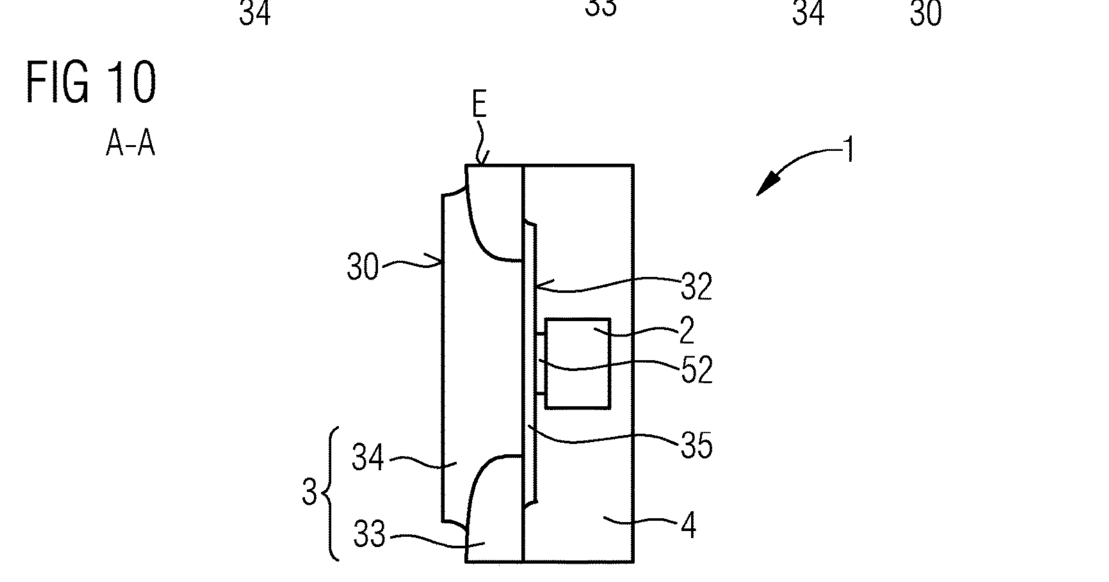
FIG. 10 shows a schematic transverse cross-section of the optoelectronic semiconductor device of FIG. 8.

FIGS. 8 to 10 illustrate another embodiment of the semiconductor device 1. As in FIGS. 1 to 3, the carrier 3 has a flat shape. However, in addition to the semiconductor device 1 of FIGS. 1 to 3, the carrier 3 includes a plurality of metallizations 35 on the mounting side 32. The metallizations 35 each start from one of the lead frame parts 34 and extend directly onto the potting body 33.

In this case, the metallizations 35 may be larger than the lead frame parts 34 at the attachment side 30, or the metallizations 35 may project beyond the lead frame parts 34 at least in places. In other words, the metallizations 35 may have a greater extent in places or all around than the lead frame parts 34 at or near the attachment side 30, where the lead frame parts 34 have their greatest lateral extent.

A thickness of the metallizations 35 is preferably small compared to the thickness Tm of the lead frame parts 34. Due to the metallizations 35, the thickness Tm is smaller than the thickness Tt of the carrier 3 as a whole. For example, the metallizations 35 have a thickness of at least 1 μm or of at least 15 μm and/or of at most 300 μm or of at most 150 μm.

The metallizations 35 can be photo-structured, for example, by means of a photomask in combination with etching. Therefore, a minimum distance Dmin between adjacent metallizations 35 can be precisely set. For example, the distance Dmin is at least 5 μm and/or at most 70 μm. This also allows flip chips to be placed as semiconductor chips 2 on the mounting side 32 directly on the metallizations 35, for example, soldered on. The distance Dmin can in particular be smaller than a minimum distance between the lead frame parts 34, in particular outside the potting body 33 on the attachment side 30.

In all other respects, the comments on FIGS. 1 to 7 apply in the same way to FIGS. 8 to 10, and vice versa.

In the exemplary embodiment of FIGS. 11 to 13, it is illustrated that the carrier 3 can again have a cavity 36. In this example, however, the potting body 33 itself is essentially plane-parallel and, in particular, is flush with the lead frame parts 34 on the mounting side 32. In order to nevertheless be able to form the cavity 36, a further potting body 37 is provided, which is applied to the mounting side 32.

The further potting body 37 and the potting body 33 may be of different materials. For example, the potting body 33 is made of a black epoxy and optimized to mechanically hold the lead frame parts 34 together. In contrast, the further potting body 37 may be white, for example, made of a silicone, and optimized for reflecting radiation generated by the semiconductor chip 2 during operation. Such further potting body 37 may also be present in designs according to FIGS. 1 to 3.

It is further illustrated in FIG. 13 that, in particular on the attachment side 30, areas of the lead frame parts 34 not covered by the potting body 33 may be covered by a wetting coating 53. The wetting coating 53 is formed, for example, by one or more metal layers. Wetting particularly refers to a solder used to attach the semiconductor device 1 to an external mounting platform, such as a printed circuit board, which is not shown. Such a wetting coating 53 may also be present in all other embodiments.

In all other respects, the comments on FIGS. 8 to 10 apply in the same way to FIGS. 11 to 13, and vice versa.

Figure 14:
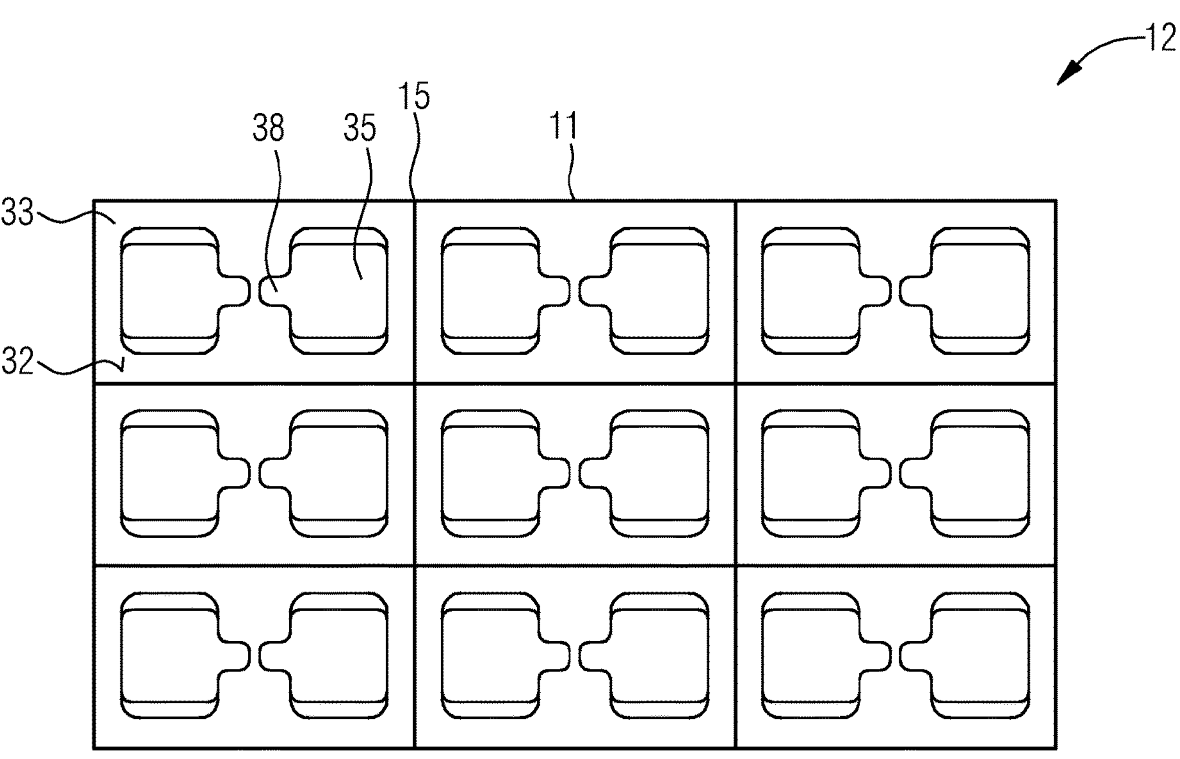
FIG. 14 shows a schematic top view of a panel for optoelectronic semiconductor devices according to FIGS. 8 to 13.

FIG. 14 shows another exemplary embodiment of the panel 10 that can be used to fabricate the semiconductor devices 1 of FIGS. 8 to 13. The panel of FIG. 14 corresponds essentially to that of FIG. 7.

Optionally, however, the metallizations 35 each have at least one protrusion 38 extending toward the adjacent metallization 35 of the respective component unit 11. A pair of the protrusions 38 may serve as a landing surface for the associated semiconductor chip 2. Such protrusions 38 may also be present in any other exemplary embodiment having metallizations 35.

In all other respects, the comments on FIGS. 1 to 13 apply in the same way to FIG. 14, and vice versa.

Figure 15:
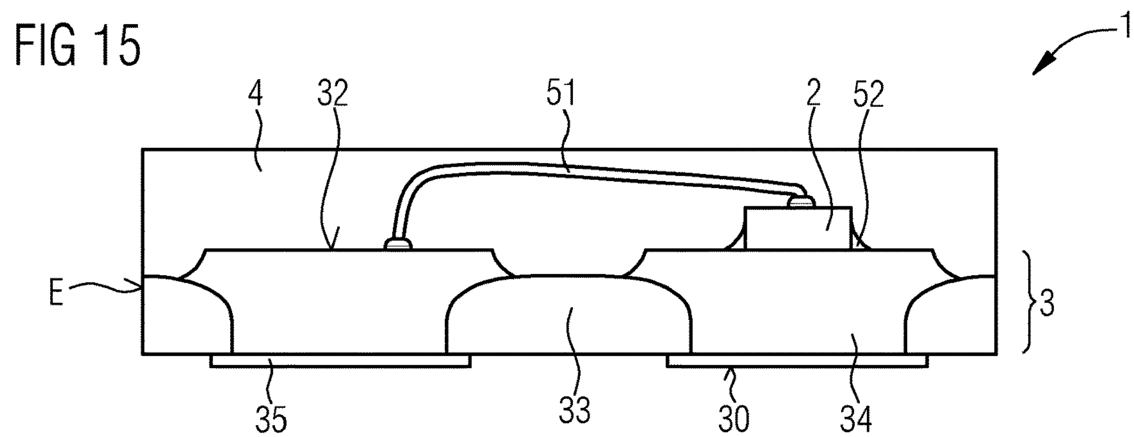
FIGS. 15 to 19 show schematic sectional views of exemplary embodiments of semiconductor optoelectronic devices described herein.

In the exemplary embodiment of FIG. 15, the lead frame parts 34 are flush or approximately flush with the attachment side 30. Thus, the lead frame parts 34 are wider at the mounting side 32 than within the potting body 34 and, in particular, wider than at the attachment side 30. That is, particularly in comparison to FIGS. 1 to 3, the carrier 3 is turned so that in FIG. 15, relative to FIGS. 1 to 3, the attachment side and the mounting side are reversed.

Optionally, the metallizations 35 are present on the attachment side 30. As also shown, for example, in FIGS. 8 to 10, the metallizations 35 could extend onto the potting body 33, starting from the at least one associated lead frame part 34.

In all other respects, the comments on FIGS. 1 to 14 apply in the same way to FIG. 15, and vice versa.

Figure 16:
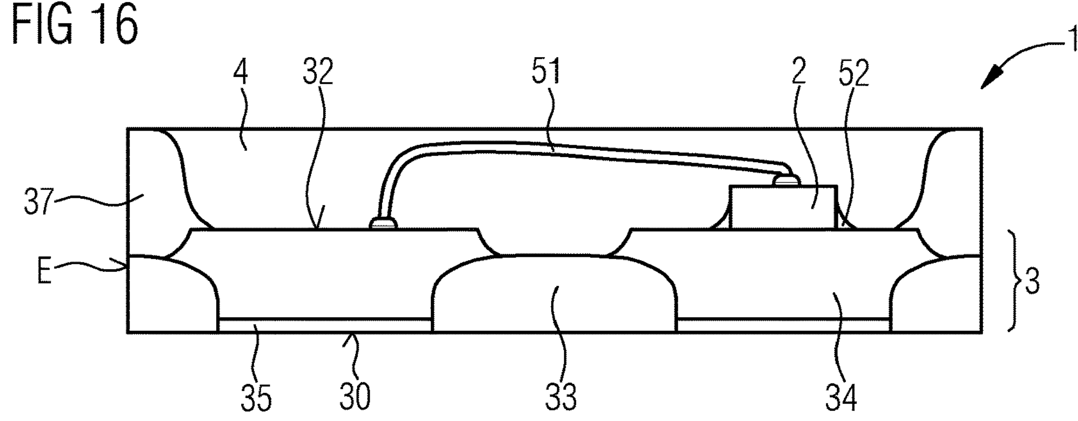

In the exemplary embodiment of FIG. 16, it is illustrated that the potting body 33 itself or the optional further potting body 37 forms the cavity 36 for the encapsulation body 4, analogous, for example, to FIGS. 11 to 13.

Furthermore, it is illustrated in FIG. 16 that the optional metallizations 35 can be flush with the potting body 33 on the attachment side 30. That is, the lead frame parts 34 are preferably recessed by a thickness of the metallizations 35 relative to the attachment side 30. In the lateral direction, the metallizations 35 can thus be flush with the lead frame parts 34.

In all other respects, the comments on FIGS. 1 to 15 apply in the same way to FIG. 16, and vice versa.

Figure 17:
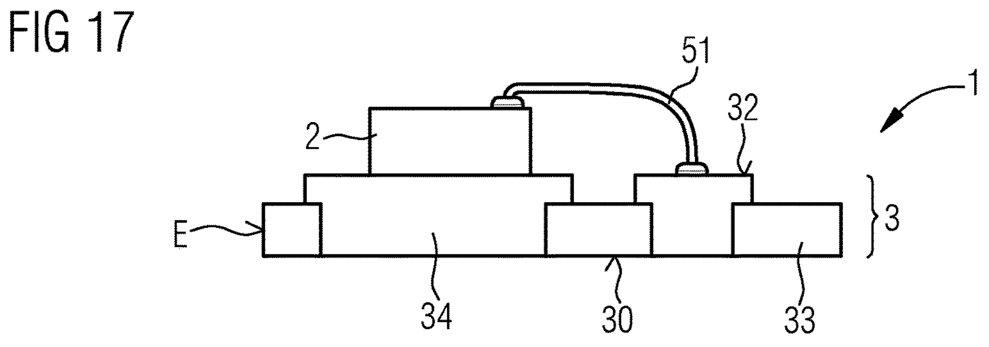

FIG. 17 illustrates that the semiconductor device 1 can be mechanically supported by the carrier 3 alone, so that no encapsulation body 4 needs to be present. Furthermore, it is possible that the potting body 33 has a multilayer structure. As in all other exemplary embodiments, it is possible that the lead frame parts 34 have flat side surfaces when viewed in cross-section and no round side surfaces, for example, due to etching, as shown in FIG. 16.

In all other respects, the comments on FIGS. 1 to 16 apply in the same way to FIG. 17, and vice versa.

Figure 18:
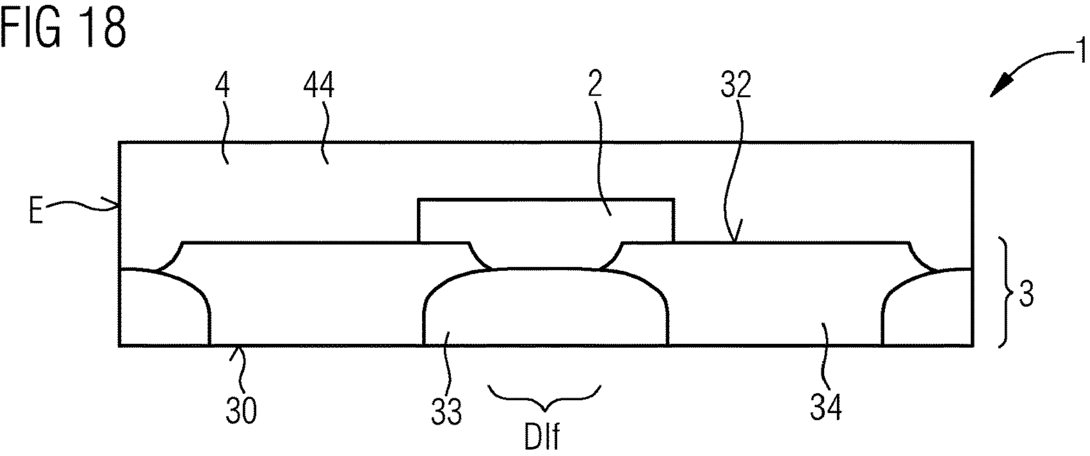

The exemplary embodiment of FIG. 18 corresponds to that of FIG. 15 or 16, wherein the optional metallizations are not drawn and wherein the semiconductor chip 1 is a flip chip, analogous to FIGS. 8 to 10. Since the lead frame parts 34 are thin at the mounting side 32 above the potting body 33 compared to an overall thickness of the lead frame parts 34, a distance Dlf between the lead frame parts 34 at the mounting side 32 may be particularly small. For example, the distance Dlf is about 50% of a thickness of the lead frame parts 34 in the region where the potting body 33 extends below the lead frame parts 34. For example, the distance Dlf is at least 10 μm and/or at most 70 μm or at most 40 μm.

Further, FIG. 18 illustrates that the encapsulation body 4 may optionally include a phosphor 44, as is possible in all other exemplary embodiments.

In all other respects, the comments on FIGS. 1 to 17 apply in the same way to FIG. 18, and vice versa.

Figure 19:
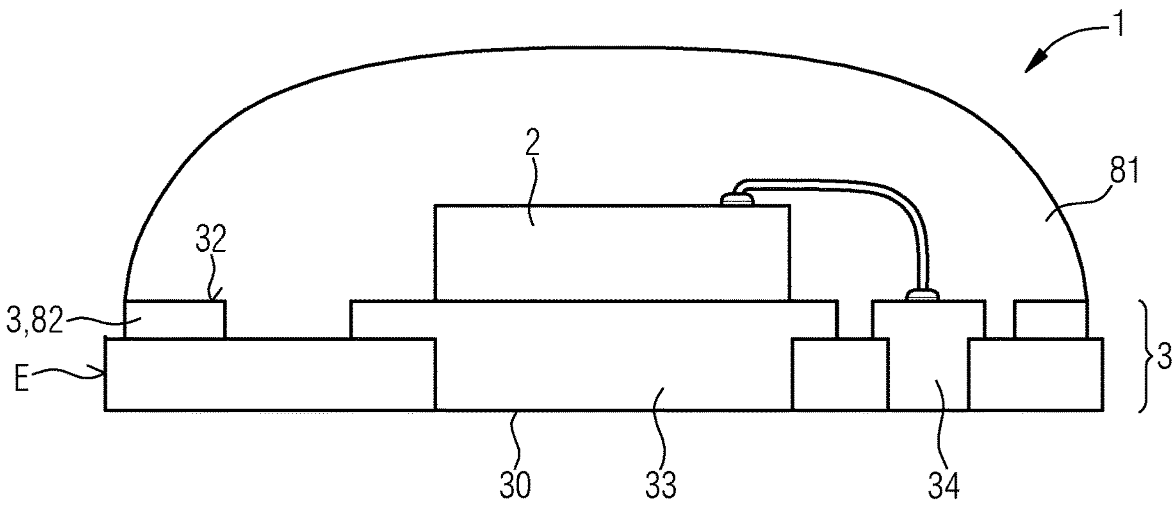

In addition to the thick lead frame parts 34 penetrating the potting body 33, the semiconductor device 1 of FIG. 19 has a thinner further lead frame part 82. A thickness of the further lead frame part 82 is, for example, equal to a thickness of the lead frame parts 34 minus a thickness of the potting body 33. Seen in plan view, the further lead frame part 82 is annular and preferably forms a stop edge for an optionally present optics body 81. The further lead frame part 82 has no electrical function.

Such further lead frame parts 82 may also be present in all other exemplary embodiments. In all other respects, the comments on FIGS. 1 to 18 apply in the same way to FIG. 19, and vice versa.

Figure 20:
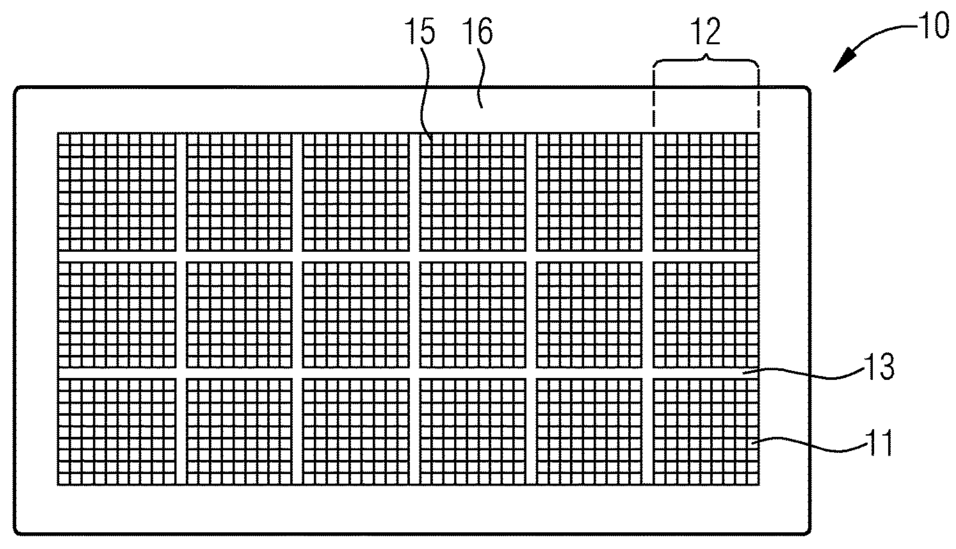
FIG. 20 shows a schematic top view of a panel for semiconductor optoelectronic devices described herein.

In FIG. 20, a panel 10 for the semiconductor devices 1 is schematically shown in plan view. The panel 10 comprises many component groups 12, each composed of a plurality of the component units 11. Within a component group 12, the potting body 33 preferably extends continuously across all of the component units 11. For example, within a component group 12 there are at least nine and/or at most 900 or at most 3000 of the component units 11.

The panel 10 may be based on a metal sheet, for example, made of a copper alloy, from which all lead frame parts 34 and the optional further lead frame parts are made. A thickness of the metal sheet is, for example, at least 20 μm and/or at most 0.5 mm. Lateral dimensions of the metal sheet may exceed 5 cm×10 cm, so that the metal sheet is provided for a plurality of semiconductor devices 1.

Between adjacent component groups 12 are support bars 13, which form a square mesh, for example. The panel 10 is mechanically stabilized by the support bars 13, which are also produced from the metal sheet. In this regard, the support bars 13 can connect opposing sides of a circumferential, frame-shaped edge 16 to one another. The edge 16 and the support bars 13 are preferably made of the same material as the lead frame parts.

It is possible that the edge 16 and the support bars 13 have an original thickness of the original metal sheet. This means that the edge 16 and the support bars 13 are preferably not reduced in thickness by etching steps. Alternatively, at least the support bars 13 can also be thinned at least in places, for example, by etching.

In all other respects, the comments on FIGS. 1 to 19 apply in the same way to FIG. 20, and vice versa.

Figure 21:
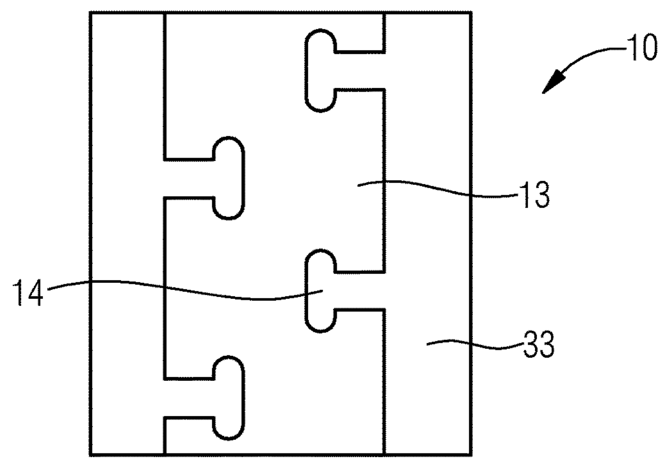
FIG. 21 shows a schematic top view of a support bar in a panel for optoelectronic semiconductor devices described herein.

FIG. 21 illustrates an exemplary support bar 13. In order to achieve a mechanical connection with the potting body 33, the support bar 13 preferably has a number of anchoring bays 14 on both sides towards the potting body 33. A widest point of the anchoring bays 14 is preferably located within the support bar 13. Viewed from above, the anchoring bays 14 are thus T-shaped, for example. The anchoring bays 14 are created in particular by means of etching, see the process steps of FIGS. 16 and 18.

Such anchoring bays 14 may also be present in all other exemplary embodiments. In all other respects, the comments on FIGS. 1 to 20 apply in the same way to FIG. 21, and vice versa.

Figure 22:
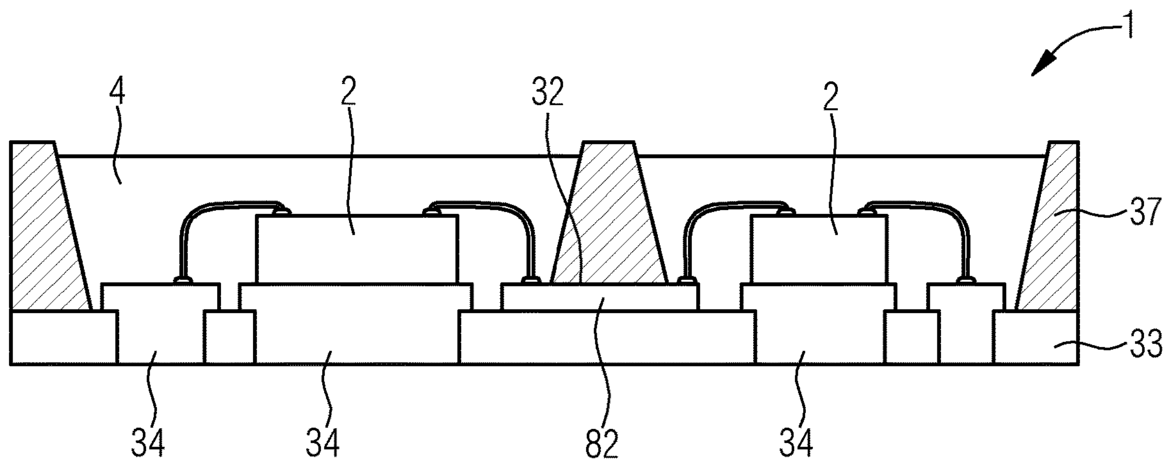
FIG. 22 shows a schematic sectional view of an exemplary embodiment of an optoelectronic semiconductor device described herein.

Finally, the semiconductor device 1 of FIG. 22 also comprises at least one further lead frame part 82, wherein the further lead frame part 82 is electrically functionalized and serves as a conductor track. With the aid of the at least one further lead frame part 82, for example, a plurality of the semiconductor chips 2 can be electrically connected within the semiconductor device 1. In addition, the further lead frame part 82 of FIG. 22 can be designed like the further lead frame part 82 of FIG. 19.

Furthermore, the comments on FIGS. 1 to 21 apply in the same way to FIG. 22, and vice versa.

The components shown in the figures preferably follow one another in the sequence indicated, in particular directly one after the other, unless otherwise described. Components not touching each other in the figures are preferably spaced apart. Insofar as lines are drawn parallel to one another, the associated surfaces are preferably likewise aligned parallel to one another. Furthermore, the relative positions of the drawn components to each other are correctly reproduced in the figures, unless otherwise specified.

The invention described herein is not limited by the description based on the embodiments. Rather, the invention encompasses any new feature as well as any combination of features, which in particular includes any combination of features in the patent claims, even if this feature or combination itself is not explicitly stated in the patent claims or embodiments.

The invention claimed is:

1. An optoelectronic semiconductor device comprising:

a carrier;

an optoelectronic semiconductor chip configured to generate radiation and attached to a mounting side of the carrier; and an encapsulation body at least partially transparent to the radiation, wherein the carrier is composed of a plurality of separate, metallic lead frame parts and of a potting body, the potting body holding the plurality of separate, metallic lead frame parts together, wherein the plurality of separate, metallic lead frame parts project beyond the potting body at the mounting side, wherein an attachment side of the carrier is opposite the mounting side so that the mounting side is further away from the attachment side than sides of the potting body facing away from the attachment side, wherein the attachment side is configured for surface mounting, wherein, as seen in a plan view of the attachment side, the potting body projects over the plurality of separate, metallic lead frame parts on all sides, wherein, on the attachment side, the potting body and the plurality of separate, metallic lead frame parts are flush with one another, or the potting body projects beyond the plurality of separate, metallic lead frame parts, and wherein, concerning dielectric solids, side surfaces of the plurality of separate, metallic lead frame parts are covered directly exclusively by the potting body or by the potting body together with the encapsulation body.

2. The optoelectronic semiconductor device according to claim 1, wherein the carrier further comprises a plurality of metallizations, wherein the plurality of metallizations partially form the mounting side and/or the attachment side, and wherein each starts from an associated one of the plurality of separate, metallic lead frame parts and extend directly onto the potting body.

3. The optoelectronic semiconductor device according to claim 2, wherein, at the mounting side, a minimum distance between adjacent metallizations is at most 70 μm.

4. The optoelectronic semiconductor device according to claim 1, wherein, at the mounting side, a minimum distance between adjacent lead frame parts is at most 70 μm.

5. The optoelectronic semiconductor device according to claim 1, wherein the plurality of separate, metallic lead frame parts are wider outside the potting body than inside the potting body as viewed in a direction parallel to the attachment side.

6. The optoelectronic semiconductor device according to claim 1, wherein, on the mounting side, the plurality of separate, metallic lead frame parts are directly surrounded all around by the potting body.

7. The optoelectronic semiconductor device according to claim 1, wherein the optoelectronic semiconductor chip is a flip chip mounted directly on the mounting side.

8. The optoelectronic semiconductor device according to claim 1, wherein the potting body is of one-piece fashion and the plurality of separate, metallic lead frame parts have a thickness of at most 0.5 mm.

9. The optoelectronic semiconductor device according to claim 1, wherein, as seen in plan view on the attachment side, a distance between an outer outline of the carrier and the plurality of separate, metallic lead frame parts is at least 10 μm and at most 1 mm all around.

10. The optoelectronic semiconductor device according to claim 1, wherein the carrier is planar, and wherein the carrier is flat such that, in a direction parallel to the attachment side, a lateral extent of the carrier is at least three times greater than a thickness of the carrier in a direction perpendicular to the attachment side.

11. The optoelectronic semiconductor device according to claim 1, wherein the potting body forms a cavity in which the semiconductor optoelectronic chip is mounted such that the potting body projects beyond the optoelectronic semiconductor chip in a direction away from the attachment side.

12. The optoelectronic semiconductor device according to claim 1, wherein the encapsulation body completely covers the optoelectronic semiconductor chip.

13. A panel carrying a plurality of optoelectronic semiconductor devices, each optoelectronic semiconductor device of the plurality of semiconductor devices comprising:

a carrier;

an optoelectronic semiconductor chip configured to generate radiation and attached to a mounting side of the carrier; and an encapsulation body at least partially transparent to the radiation, wherein the carrier is composed of a plurality of separate, metallic lead frame parts and of a potting body, the potting body holding the plurality of separate, metallic lead frame parts together, wherein the plurality of separate, metallic lead frame parts project beyond the potting body at the mounting side, wherein an attachment side of the carrier is opposite the mounting side so that the mounting side is further away from the attachment side than sides of the potting body facing away from the attachment side, wherein the attachment side is configured for surface mounting, wherein, as seen in a plan view of the attachment side, the potting body projects over the plurality of separate, metallic lead frame parts on all sides, wherein, on the attachment side, the potting body and the plurality of separate, metallic lead frame parts are flush with one another, or the potting body projects beyond the plurality of separate, metallic lead frame parts, and wherein, concerning dielectric solids, side surfaces of the plurality of separate, metallic lead frame parts are covered directly exclusively by the potting body or by the potting body together with the encapsulation body; and the panel comprising:

a plurality of component units such that each of the plurality of component units is provided with one of the plurality of optoelectronic semiconductor devices, wherein the potting body extends continuously across all of the plurality of component units of a component group, wherein the panel comprises a plurality of the component groups such that each of the plurality of component groups includes a plurality of the component units, wherein a metallic support bar is located between at least some adjacent component groups and extends continuously along a plurality of the component groups, wherein the metallic support bar is of the same material as the plurality of separate, metallic lead frame parts and is at least as thick as the plurality of separate, metallic lead frame parts, wherein the metallic support bar comprises a plurality of anchoring bays as viewed in plan view of the attachment sides of adjacent ones of the component units, and wherein the potting body engages in the plurality of anchoring bays.

14. An optoelectronic semiconductor device comprising:

a carrier;

an optoelectronic semiconductor chip configured to generate radiation and attached to a mounting side of the carrier;

an encapsulation body at least partially transparent to the radiation, wherein the carrier is composed of a plurality of separate, metallic lead frame parts and of a potting body, the potting body holding the plurality of separate, metallic lead frame parts together; and a further lead frame part, wherein the further lead frame part is thinner than the carrier, wherein the further lead frame part is made of the same material as the plurality of separate, metallic lead frame parts, wherein the plurality of separate, metallic lead frame parts project beyond the potting body at the mounting side, wherein an attachment side of the carrier is opposite the mounting side so that the mounting side is further away from the attachment side than sides of the potting body facing away from the attachment side, wherein the attachment side is configured for surface mounting, wherein, as seen in a plan view of the attachment side, the potting body projects over the plurality of separate, metallic lead frame parts on all sides, wherein, on the attachment side, the potting body and the plurality of separate, metallic lead frame parts are flush with one another, or the potting body projects beyond the plurality of separate, metallic lead frame parts, and wherein, concerning dielectric solids, side surfaces of the plurality of separate, metallic lead frame parts are covered directly exclusively by the potting body or by the potting body together with the encapsulation body.

15. The optoelectronic semiconductor device according to claim 14, wherein the further lead frame part is electrically non-functional and electrically isolated from the plurality of separate, metallic lead frame parts.

16. An optoelectronic semiconductor device comprising:

a carrier;

an optoelectronic semiconductor chip configured to generate radiation and attached to a mounting side of the carrier; and an encapsulation body at least partially transparent to the radiation, wherein the carrier is composed of a plurality of separate, metallic lead frame parts and of a potting body, the potting body holding the plurality of separate, metallic lead frame parts together, wherein the plurality of separate, metallic lead frame parts project beyond the potting body at the mounting side, wherein an attachment side of the carrier is opposite the mounting side so that the mounting side is further away from the attachment side than sides of the potting body facing away from the attachment side, wherein the attachment side is configured for surface mounting, wherein, as seen in a plan view of the attachment side, the potting body projects over the plurality of separate, metallic lead frame parts on all sides, wherein, on the attachment side, the potting body and the plurality of separate, metallic lead frame parts are flush with one another, or the potting body projects beyond the plurality of separate, metallic lead frame parts, wherein, concerning dielectric solids, side surfaces of the plurality of separate, metallic lead frame parts are covered directly exclusively by the potting body or by the potting body together with the encapsulation body, and wherein the plurality of separate, metallic lead frame parts has a greater thickness than the potting body.

17. The optoelectronic semiconductor device according to claim 16, wherein each one of the plurality of separate, metallic lead frame parts has a first main face and a second main face, the first main faces are in each case part of the mounting side and the second main faces are in each case flush with the potting body, and wherein the first and second main faces are in each case free of the potting body.

18. The optoelectronic semiconductor device according to claim 16, wherein each one of the plurality of separate, metallic lead frame parts has a first main face and a second main face, the first main faces are in each case part of the mounting side and the second main faces provided with metallizations are in each case flush with the potting body, and wherein the first and second main faces and the metallizations are in each case free of the potting body.

19. The optoelectronic semiconductor device according to claim 16, wherein each one of the plurality of separate, metallic lead frame parts has a first main face and a second main face, the first main faces are in each case part of the mounting side and the second main faces provided with metallizations are in each case flush with the potting body, and wherein the first and second main faces and the metallizations are in each case free of the potting body.

* * * * *